United States Patent
Gupta (10) Patent No.: US 12,113,530 B2
(45) Date of Patent: Oct. 8, 2024

(54) MICROELECTRONIC CIRCUIT CAPABLE OF SELECTIVELY ACTIVATING PROCESSING PATHS, AND A METHOD FOR ACTIVATING PROCESSING PATHS IN A MICROELECTRONIC CIRCUIT

(71) Applicant: MINIMA PROCESSOR OY, Oulu (FI)

(72) Inventor: Navneet Gupta, Oulu (FI)

(73) Assignee: MINIMA PROCESSOR OY, Oulu (FI)

( * ) Notice: Subject to any disclaimer, the term of this patent is extended or adjusted under 35 U.S.C. 154(b) by 616 days.

(21) Appl. No.: 17/311,197

(22) PCT Filed: Dec. 5, 2018

(86) PCT No.: PCT/FI2018/050883
§ 371 (c)(1),
(2) Date: Jun. 4, 2021

(87) PCT Pub. No.: WO2020/115353
PCT Pub. Date: Jun. 11, 2020

(65) Prior Publication Data
US 2022/0021390 A1 Jan. 20, 2022

(51) Int. Cl.
*H03K 19/17736* (2020.01)
*H03K 5/15* (2006.01)
*H03K 17/28* (2006.01)

(52) U.S. Cl.
CPC ..... *H03K 19/1774* (2013.01); *H03K 5/15093* (2013.01); *H03K 17/28* (2013.01)

(58) Field of Classification Search
CPC ........... H03K 19/1774; H03K 5/15093; H03K 17/28; H03K 5/1534; H03K 3/013;
(Continued)

(56) References Cited

U.S. PATENT DOCUMENTS 5,633,609 A    5/1997 Duncan
9,223,327 B1   12/2015 Zhu et al.
(Continued)

FOREIGN PATENT DOCUMENTS

CN    106209060 A    12/2016
WO    WO 2018/193150 A1    10/2018

OTHER PUBLICATIONS

Extended European Search Report for European Application No. 18942544.0 mailed Jun. 24, 2022 (10 pages).
(Continued)

*Primary Examiner* — Daniel D Chang
(74) *Attorney, Agent, or Firm* — Alston & Bird LLP (57) ABSTRACT

A microelectronic circuit comprises a plurality of logic units and register circuits arranged into a plurality of processing paths. At least one monitor circuit (404) is associated with a first register circuit (301), said monitor circuit (404) being configured to produce a timing event observation signal as a response to a change in a digital value at an input (D) of the first register circuit (301) that took place later than an allowable time limit defined by a triggering signal (CP) to said first register circuit (301). A first processing path goes through a first logic unit (501) to said first register circuit (301) and is a delay critical processing path due to an amount of delay that it is likely to generate. The microelectronic circuit comprises a controllable data event injection point (503) for controllably generating a change of a digital value propagating to said first logic unit (501) irrespective of what other data is processed on said first processing path. Said microelectronic circuit is configured to freeze a first digital value stored in said first register circuit (301) for a time during which the change generated through said controllable data event injection point (503) propagates to said first register circuit.

13 Claims, 6 Drawing Sheets

(58) Field of Classification Search
CPC .... H03K 3/037; H03K 19/003; H03K 19/007; G06F 11/3024; G06F 2201/86; G06F 1/324; G06F 1/3296; G06F 1/3206; Y02D 10/00

See application file for complete search history.

(56) References Cited

U.S. PATENT DOCUMENTS

| | | |
|---|---|---|
| 10,069,486 B1* | 9/2018 | Devlin ................ H03K 3/0372 |
| 10,924,098 B2 | 2/2021 | Turnquist et al. |
| 2007/0164787 A1* | 7/2007 | Grochowski .... G01R 31/31922 326/46 |
| 2009/0044160 A1 | 2/2009 | Bueti et al. |
| 2013/0003905 A1 | 1/2013 | Jain et al. |
| 2013/0088256 A1 | 4/2013 | Chlipala et al. |
| 2014/0122947 A1 | 5/2014 | Bowman et al. |
| 2018/0253521 A1 | 9/2018 | Shan et al. |

OTHER PUBLICATIONS

International Search Report for PCT/FI2018/050883 (ISA/FI) mailed Sep. 5, 2019 (5 pages).
Written Opinion for PCT/FI2018/050883 (ISA/FI) mailed Sep. 5, 2019 (9 pages).

* cited by examiner

MICROELECTRONIC CIRCUIT CAPABLE OF SELECTIVELY ACTIVATING PROCESSING PATHS, AND A METHOD FOR ACTIVATING PROCESSING PATHS IN A MICROELECTRONIC CIRCUIT

CROSS-REFERENCE TO RELATED APPLICATIONS

The present application is a national phase entry of International Application No. PCT/FI2018/050883, filed Dec. 5, 2018, the entire contents of which are incorporated herein by reference.

FIELD OF THE INVENTION

The invention is related to the technology of microelectronic circuits that comprise internal monitors for detecting timing events. In particular the invention concerns a way in which it can be ensured that pertinent results are available from the monitors irrespective of the currently executed payload software.

BACKGROUND OF THE INVENTION

Time borrowing in a microelectronic circuit means that a circuit element is temporarily allowed to borrow time from a subsequent stage, i.e. change a digital value later than expected, if the subsequent circuit element(s) on the same processing path can handle it without corrupting the data that is being processed. Time borrowing may be combined for example with AVS (Advanced Voltage Scaling), so that the occurrence of time borrowing is detected as a timing event, and an increasing number of detected timing events causes an increase in the operating voltage and vice versa. The number of detected timing events may also trigger other compensating actions, typically involving changes in the values of other operating parameters of the circuit, like the clock frequency for example, or temporarily changing the clock waveform.

Processing paths in the microelectronic circuit go through logic units and register circuits, so that a register circuit stores the output value of a preceding logic unit at the rising or falling edge of a triggering signal (the register circuit is a flip-flop) or at a high or low level of the triggering signal (if the register circuit is a latch). A triggering edge or some other controlling event of the triggering signal defines an allowable time limit before which a digital value must appear at a data input of the register circuit to become properly stored. The allowable time limit is not necessarily the exact moment of the triggering edge, but defined in some relation to it due to physical effects such as the finite rate at which a voltage level can change. The logic units may also be referred to as pieces of combinatorial logic.

Monitor circuits are used to detect timing events. A monitor circuit is a circuit element or functionality added to or associated with a register circuit and configured to produce a timing event observation (TEO) signal as a response to a change in the input digital value that took place later than said allowable time limit. In addition to the actual monitor circuits the microelectronic circuit must comprise an OR-tree and/or other structures for collecting, processing, and analyzing the TEO signals from the monitor circuits.

A major drawback of monitor circuits is that they consume circuit area and operating power. Placing monitor circuits into a microelectronic circuit that is being designed involves compromises. The more monitor circuits, the better the coverage for detecting timing events, but simultaneously the more circuit area and operating power is consumed for other purposes than the one for which the microelectronic circuit was designed in the first place.

Knowledge about how circuit elements work allows the designer of a microelectronic circuit to make a delay distribution analysis that tells, how much delay each circuit element will cause to the data that proceeds through it. A straightforward guideline for placing monitor circuits would involve categorizing the circuit elements into delay classes according to how long delays they will cause, and placing monitors to only those register circuits that come after circuit elements of the longest delay class on the processing paths. However, that will provide only a partial solution to the problem, for a number of reasons.

First, individual variation between manufactured microelectronic circuits makes it uncertain, which circuit elements will actually be the critical ones. A circuit element that according to the delay distribution analysis belonged only the second or third longest delay class might actually be the most critical circuit element in a real-life manufactured circuit. Second, executed software might be such that—at least under certain circumstances—it does not use those processing paths that go through the most delay-critical circuit elements for extended periods of time, so that the timing events that should be detected actually take place on those processing paths that were not deemed critical in the delay distribution analysis. Third, even if data is currently flowing through (also) the delay-critical processing paths it may happen that for the moment that data contains extended sequences of constant (unchanging) digital values, which naturally makes the detection of timing events on those paths impossible because timing events can only occur when a digital value changes at the input of a register circuit.

Additional complexity to the task of designing a microelectronic circuit comes from the requirement of testability. The concept of DFT (Designed For Testability, or Design-For-Test) has become a de facto industrial standard that defines certain procedures for testing a microelectronic circuit. As an example, it should be possible to selectively couple the register circuits contained in the microelectronic circuit into long chains that operate essentially as shift registers: a string of digital values can be fed in from one end and read out from the other end. Passing a known test pattern through such a chain of register circuits and checking its form at the output tells whether all register circuits in the chain are changing their states as desired or whether there are register circuits that are stuck at some particular value (stuck-at fault test). An at-speed fault test involves feeding in a test pattern slowly at a low clock speed, then giving one or more clock pulses at the full operating speed so that the test pattern proceeds in the chain at functional logic speed by as many steps as there are clock pulses, and finally clocking the test pattern out again at a low clock speed. The at-speed test may give information about register circuits that are slower than intended. If there are monitor circuits and time borrowing capability involved, also these should be testable.

SUMMARY

It is an objective of the invention to present a microelectronic circuit, circuit elements of a microelectronic circuit, and a method for operating a microelectronic circuit that enable detecting the possible occurrence of timing events on delay-critical processing paths even when normal operation of the microelectronic circuit would make such detecting uncertain or improbable. Another objective is to allow performing such detecting without disturbing the normal operation of the microelectronic circuit. A further objective is to enable the combination of detecting of the above-described kind with advanced voltage scaling. Yet another objective is to combine this kind of functionalities with DFT compatibility.

The objectives of the invention are achieved by suitable designs of controllable data event injection points, for controllably generating changes of digital values propagating on a delay-critical processing path, irrespective of what other data is processed on the processing paths.

According to a first aspect there is provided a microelectronic circuit that comprises a plurality of logic units and register circuit. Said logic units and register circuits are arranged into a plurality of processing paths. The microelectronic circuit comprises at least one monitor circuit associated with a first register circuit of said plurality of register circuits. Said monitor circuit is configured to produce a timing event observation signal as a response to a change in a digital value at an input of the first register circuit that took place later than an allowable time limit defined by a triggering signal to said first register circuit. A first processing path of said plurality of processing paths goes through a first logic unit of said plurality of logic units to said first register circuit. Said first processing path is a delay-critical processing path due to an amount of delay that it is likely to generate. The microelectronic circuit comprises, on the first processing path leading to said first logic unit, a controllable data event injection point for controllably generating a change of a digital value propagating to said first logic unit irrespective of what other data is processed on said first processing path. Said microelectronic circuit is configured to freeze a first digital value stored in said first register circuit for a time during which the change generated through said controllable data event injection point propagates to said first register circuit.

According to an embodiment said first register circuit comprises a data input, a data output, and between said data input and data output a series connection of a first subregister stage and second subregister stage. Each of said first and second subregister stage has a respective triggering signal input. Said microelectronic circuit is configured to perform said freezing of said first digital value by temporarily preventing changes in the signals fed into said triggering signal inputs of said first and second subregister stages. This involves the advantage that a simple but reliable mechanism is available for freezing said first digital value.

According to an embodiment a control unit of said microelectronic circuit is configured to initiate said controllable generating of said change of said digital value propagating to said first logic unit by changing the value of a control signal. The microelectronic circuit comprises a gating unit for gating, with said control signal, the signal going to the triggering signal input of said first subregister stage. This involves the advantage that a simple but reliable mechanism is available for controlling the events related to the activation of one or more processing paths.

According to an embodiment said control unit is configured to initiate said controllable generating of said change of said digital value propagating to said first logic unit as a response to the occurrence of a no-operation instruction in a program that is executed. This involves the advantage that the activation of one or more processing paths does not cause any disturbance to the way in which data is otherwise processed in the microelectronic circuit.

According to an embodiment the microelectronic circuit comprises one or more unblocking units on one or more other processing paths coming to said first logic unit. Said one or more unblocking units are configured to prevent signals on said one or more other processing paths from blocking the propagation of the generated change of said digital value through said first logic unit to said first register circuit. This involves the advantage that the controllably injected data event can be ensured to arrive at its intended destination without becoming blocked.

According to an embodiment at least part of said microelectronic circuit consists of adaptive circuit elements the performance of which is configurable by making one or more operating parameters of the microelectronic circuit each assume a respective operating parameter value. This involves the advantage that the selectable activation of dedicated processing paths may be combined to the adapting of the operation of the microelectronic circuit.

According to an embodiment said one or more operating parameters comprise one or more of the following: an operating voltage, a frequency of a triggering signal, a length of a timing event detection window. This involves the advantage that versatile possibilities are available for adapting the operation of the microelectronic circuit.

According to a second aspect there is provided a register circuit for temporarily storing a digital value on a processing path of a microelectronic circuit. The register circuit comprises a data input, a data output, and a first subregister stage and a second subregister stage in series along a data propagation path between said data input and data output. The register circuit comprises a triggering event input for receiving a triggering signal, a triggering edge of which is to define an allowable time limit before which a digital value must appear at a data input of said first subregister stage to become temporarily stored. The register circuit comprises a timing event observation stage coupled to said data propagation path and configured to output a timing event observation signal at an output of said register circuit as an indicator of said digital value at said data input having changed within a time window that begins at said allowable time limit and is shorter than one cycle of said triggering signal. The register circuit comprises a delayed triggering event input coupled to said first subregister stage for receiving, in said first subregister stage, a delayed triggering signal, a triggering edge of which is to define an end of said time window. The register circuit comprises a control signal input for receiving a control signal, and a gating unit for gating, with said control signal, the delayed triggering signal going to the delayed triggering event input of said first subregister stage.

According to an embodiment the register circuit is an adaptive register circuit the performance of which is configurable by making one or more operating parameters of the register circuit each assume a respective operating parameter value. This involves the advantage that the register circuit can contribute to power saving in a microelectronic circuit through adapting values of its operating parameters.

According to a third aspect there is provided a method for operating a microelectronic circuit. The method comprises during a period of inactivity on a delay-critical processing path of the microelectronic circuit, activating said delay-critical processing path by controllably generating a change of a digital value propagating to a first logic unit on said delay-critical processing path. The method comprises freezing, for a time during which said controllably generated change propagates to a first register circuit located after said first logic unit on said delay-critical processing path, a first digital value stored in said first register circuit.

According to an embodiment said period of inactivity is either a period of inactivity deliberately generated by disabling a clock signal for one or more clock cycles or an occurrence of a no-operation instruction in the microelectronic circuit. This involves the advantage that there are versatile possibilities for selecting the instant of time when the activation of a processing path is executed.

According to an embodiment said freezing of said first digital value is done by preventing a triggering signal from triggering at least one subregister stage in said first register circuit. This involves the advantage that a simple but reliable mechanism is available for freezing said first digital value.

According to an embodiment the method comprises preventing digital values coming from other processing paths to said first logic unit from blocking the propagation of said controllably generated change through said first logic unit to said first register circuit. This involves the advantage that the controllably injected data event can be ensured to arrive at its intended destination without becoming blocked.

According to an embodiment the method comprises using said controllably generated change to detect whether a delay longer than an allowable limit occurs in said first logic unit, and adapting the performance of the microelectronic circuit by making an operating parameter assume an operating parameter value depending on whether a delay longer than said allowable limit was detected to occur in said first logic unit. This involves the advantage that educated and accurate decisions can be made about adapting the performance of the microelectronic circuit.

According to a fourth aspect there is provided a computer-readable medium having a computer-readable program product stored thereon, the computer-readable program product comprising one or more sets of one or more computer-readable instructions that, when executed by one or more processors, are configured to cause the execution of a method for operating a microelectronic circuit. The method meant here comprises during a period of inactivity on a delay-critical processing path of the microelectronic circuit, activating said delay-critical processing path by controllably generating a change of a digital value propagating to a first logic unit on said delay-critical processing path, and freezing, for a time during which said controllably generated change propagates to a first register circuit located after said first logic unit on said delay-critical processing path, a first digital value stored in said first register circuit.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

In the following, microelectronic circuits and methods for their designing and operating will be described. A typical microelectronic circuit comprises a plurality of logic units and register circuits, arranged into a plurality of processing paths. A processing path is a sequence of circuit elements through which digital data may pass, so that it gets processed in logic units and temporarily stored in register circuits that are located between consecutive logic units on said processing paths. The software that the microelectronic circuit executes defines, which processing paths are used at any given time and in which way.

In order to provide better understanding to some of the details explained later, an example of a register circuit is described with reference to FIG. 1. The register circuit of FIG. 1 comprises a first subregister stage 101 and a second subregister stage 102. The data input and data output of the first subregister stage 101 are marked as i1 and q1 respectively, and the data input and data output of the second subregister stage 102 are marked as i2 and q2 respectively. The data input D of the register circuit is coupled to the data input i1 of the first subregister stage 101 through a multiplexer 103, so that a high level of the control signal SE causes a test input SI to be coupled to the data input i1 of the first subregister stage 101 instead. The data output q2 of the second subregister stage 102 is coupled to the data output Q of the register circuit.

The register circuit comprises two triggering signal inputs for the triggering signals CP and CPD. The first-mentioned can be called here the clock signal. For reasons explained in more detail below the other triggering signal CPD is a delayed version of the clock signal CP, preferably so that the delay is not more than one half cycle of CP, and can thus be called the delayed clock signal. Depending on the value (low/high) of the control signal TTBEN, either the delayed clock signal CPD or the clock signal CP is coupled to the triggering signal input of the first subregister stage 101. The clock signal CP is coupled to the triggering signal input of the second subregister stage 102.

The register circuit of FIG. 1 comprises, or is associated with, a monitor circuit 105 that is configured to produce a timing event observation (TEO) signal as a response to a change in a digital value at the data input D of the register circuit that took place later than an allowable time limit. The time limit is defined by the clock signal CP and by the physical characteristics of the appropriate circuit elements. Simplified, the digital value at the data input D should just have assumed its appropriate value before a triggering edge in the clock signal CP, so that if a change that was supposed to come before the triggering edge comes after it, it is late. In practice there are factors like finite rising and falling times, which means that the allowable time limit is not exactly the moment of the triggering edge but typically slightly earlier. In some special cases it may be even slightly later.

The data input D1 of the monitor circuit 105 receives a copy of what goes into the data input i1 of the first subregister stage 101. The clock pulse input CPP of the monitor circuit 105 receives a triggering signal that defines the allowable time limit after which a change in the digital value at the data input of the register circuit is late. The triggering signal received at the clock pulse input CPP may define the so-called TEO window, so that it defines also an end limit, after which the monitor circuit 105 does not react any more to a change in the input data.

At its timing event output TE the monitor circuit 105 is configured to produce the TEO signal. Here we may assume a signal level convention according to which the TEO signal is normally low, but goes high at the moment of observing a timing event and remains high until the end of the clock cycle during which the timing event was observed. With a suitable value of the control signal TMTEOH the monitor circuit 105 may be made to maintain the high value, once occurred, of the TEO signal longer than just until the end of the clock cycle. This function is useful for example in test mode, in which a maintained high value of the TEO signal may be collected for further processing and analysis.

The use of a delayed clock signal CPD as the triggering signal of the first subregister stage 101 makes the register circuit capable of time borrowing. In other words, a logic unit or other part of processing path that precedes this kind of a register circuit is temporarily allowed to cause a timing event, i.e. a late change of a digital value, because the register circuit of FIG. 1 can handle it without corrupting the data that is being processed. As long as the late-arriving change of digital value at the data input D comes before the triggering edge in the delayed clock signal CPD, it will get correctly stored in the register circuit. (To be quite exact, there are rising and falling times involved also here, so the ultimate limit is some allowable time limit defined by the delayed clock signal CPD, not necessarily the exact moment of the triggering edge thereof.) Time borrowing can be disabled by making the value of the control signal TTBEN low, in which case the clock signal CP is used as the triggering signal of the first subregister stage 101.

The data input i2 of the second subregister stage 102 receives either the value at the data output q1 of the first subregister stage 101 or the value at the TE output of the monitor circuit 105, depending on the value of the control signal TMSE that controls the multiplexer 106. Here it is assumed that the microelectronic circuit comprises a so-called common scan chain that is used to collect the digital values that the tested circuit elements produce during test mode. A high value of the control signal TMSE causes the output value of the monitor circuit 105 to be directed to the common scan chain, while a low value of TMSE directs the actual, temporarily stored digital value that went to the first and second subregister stages to the common scan chain. The control signal CDN to the second subregister circuit 102 is an asynchronous reset signal.

Figure 1:
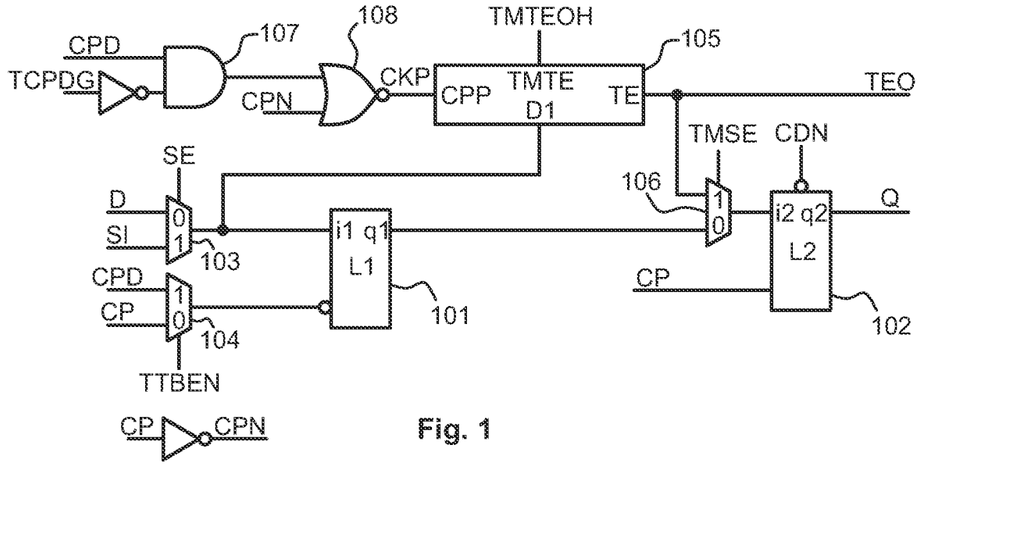
FIG. 1 illustrates a register circuit that allows time borrowing.
Figure 2:
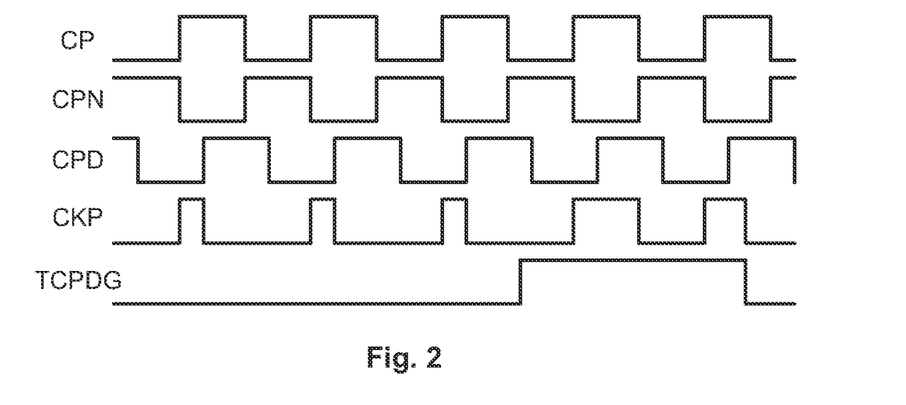
FIG. 2 illustrates waveforms of some signals in association with the register circuit of FIG. 1.

FIG. 1 illustrates one possible way of producing the triggering signal CKP that goes into the clock pulse input CPP of the monitor circuit. The associated waveforms are shown in FIG. 2. Normally the signal TCPDG is low and its inverse thus high, so the delayed clock signal CPD goes as such through the AND gate 107 to one input of the NOR gate 108. The other input of the NOR gate 108 receives an inverse CPN of the clock signal CP. The triggering signal CKP that goes into the triggering input CPP of the monitor circuit 105 is high for the duration between rising edges in the clock and delayed clock signals CP and CPD. When the signal TCPDG goes high, its inverse goes low, and the output of the AND gate 107 remains low. This makes the triggering signal CKP and inverse of the inverted clock signal CPN, i.e. equal to the clock signal CP.

The exact way in which the monitor circuit 105 is implemented internally is of lesser importance, as long as it is capable of performing the functions described in this text. Examples of physical implementations of monitor circuits are found for example in the patent application number PCT/FI2017/050290.

It is not advisable to equip each and every register circuit of a microelectronic circuit with a monitor circuit, because the monitor circuits consume circuit area and operating power within the microelectronic circuit. Monitor circuits are of best use when placed after those logic units that are most likely to cause the longest delays. These can be found with proper analyzing tools during designing the microelectronic circuit. The TEO signals from the monitor circuits can be used for example for AVS (Advanced Voltage Scaling), for example so that if the number of detected timing events per unit time gets higher than an allowable limit, operating voltage is increased.

However, such a control strategy might not work appropriately if the lack (or low number) of TEO signals from a processing path is caused by the small number of data events in that processing path, rather than by the logic units working sufficiently fast. A data event is an intentional change of a digital value. If a processing path is currently not getting any digital data to process, or if for some reason the digital data that goes through a monitor-equipped register circuit in that processing path consists of a very long sequence of a constant, unchanging value, there will be no TEO signals even if one or more logic units in that processing path are already working unallowably slow. This might lead to a situation in which the operating voltage is lowered so much that excessive delays begin to occur even on such processing paths that were not considered critical in designing the microelectronic circuit and were consequently not equipped with monitors in their register circuits.

Therefore it is advantageous to provide the microelectronic circuit with the capability of deliberately activating delay-critical processing paths. In a microelectronic circuit that comprises a plurality of processing paths, a particular processing path is delay-critical due to an amount of delay that it is likely to generate. Finding out the delay that the various processing paths are likely to generate is a technique known as such, and constitutes a routine part of analyzing a microelectronic circuit that is being designed. A particular processing path may be delay-critical due to the amount of delay that a single, particularly delay-prone logic unit on that processing path is likely to generate, and/or due to the combined amount of delay that consecutive logic units on that processing path are likely to generate in total. It is advantageous to take the delay-criticality of a processing path into account by placing therein, downstream from the delay-generating circuit element(s), a register circuit that is capable of timing event detection and that may additionally be capable of time borrowing.

Activating a delay-critical processing path means in this text the act of controllably generating a change of a digital value propagating on the processing path in question. Such a controllably generated change of a digital value may occur irrespective of what other data (if any) is currently processed on the processing path in question. The need for such activating may come from the fact that no digital values are currently propagating on that processing path at all, and/or from the fact that there is a long sequence of constant, non-changing digital values propagating on that processing path. In order not to corrupt the "actual" digital data, if there is such, it is advisable to freeze digital values stored in one or more register circuits on the activated delay-critical processing path for the time during which the "artificially" generated change propagates to such register circuits.

Figure 3:
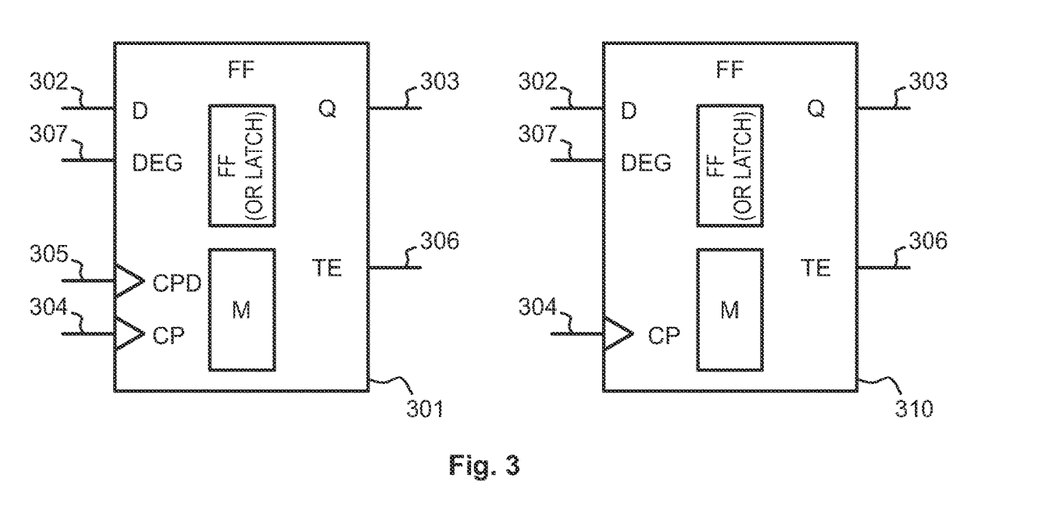
FIG. 3 illustrates two examples of register circuits that allow activating processing paths.
Figure 4:
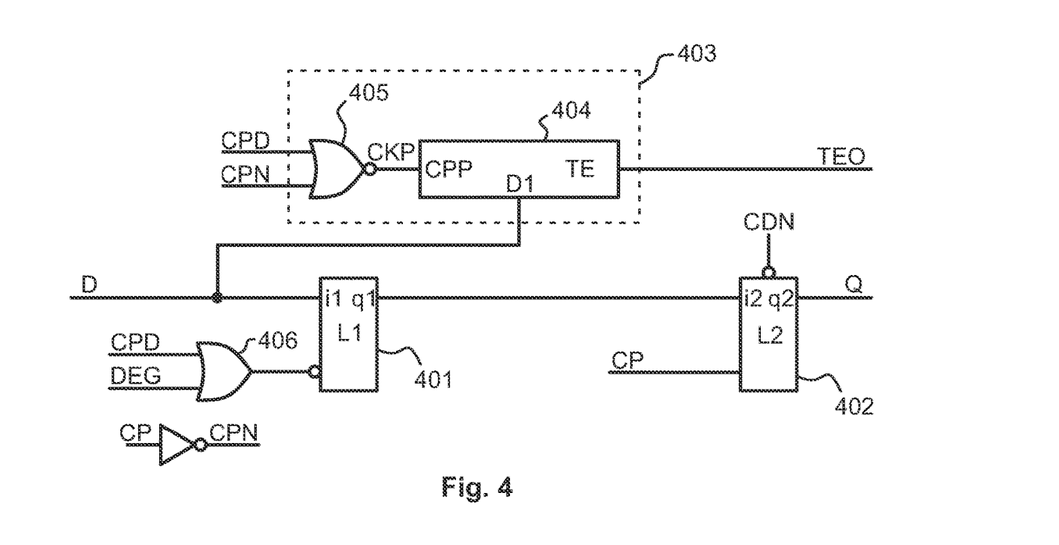
FIG. 4 illustrates an example implementation of one register circuit of the kind shown in FIG. 3.

FIG. 3 illustrates a register circuit 301 on the left, for temporarily storing a digital value on a processing path of a microelectronic circuit. FIG. 4 shows a more detailed example of one way in which the register circuit 301 may be implemented with two subregister stages (here: latches) and a monitor circuit. The register circuit 301 comprises a data input 302 and a data output 303, also marked with the symbols D and Q respectively. There is a first subregister stage 401 and a second subregister stage 402 coupled in series along the data propagation path between the data input 302 and the data output 303.

The register circuit 301 comprises a triggering event input 304 for receiving a triggering signal, a triggering edge of which is to define an allowable time limit before which a digital value should appear at a data input i1 of the first subregister stage 401 to become temporarily stored according to the rules of appropriate timing. The register circuit 301 comprises also a timing event observation stage 403 coupled to the data propagation path (here: to the data input i1 of the first subregister stage 401). The timing event observation stage 403 is configured to output a timing event observation signal TEO at an output 306 of the register circuit 301 as an indicator of a digital value at said data input having changed late. The definition of "late" is here: within a time window that begins at said allowable time limit and is shorter than one cycle of said triggering signal.

The timing event observation stage 403 is here shown to comprise a monitor circuit 404 and a NOR gate 405 that is used to form the triggering signal CKP that triggers the monitor circuit 404.

The register circuit 301 comprises a delayed triggering event input 305 that is coupled to the first subregister stage 401 and provided for receiving, in the first subregister stage 401, a delayed triggering signal CPD. A triggering edge in said delayed triggering signal CPD defines an end of the time window mentioned above. The roles of the triggering signals CP and CPD are the same as above in relation to FIGS. 1 and 2: the time window for allowing and detecting a late change in the data input is between a rising edge in the triggering signal CP and the next rising edge in the delayed triggering signal CPD. The inputs to the NOR gate 405 are the delayed triggering signal CPD and the inverse CPN of the triggering signal CP.

The register circuit 301 comprises also a control signal input 307 for receiving a control signal DEG, or Data Event Generation. There is a gating unit 406 for using the control signal DEG to gate the delayed triggering signal that goes to the delayed triggering event input of the first subregister circuit 401. Because of the inverter at the delayed triggering event input of the first subregister circuit 401, the gating works in the following way. When the control signal DEG is low, the first subregister stage 401 is enabled when the delayed triggering signal CPD is low, and disabled when it is high. When the control signal DEG is high, the output of the gating unit 406 remains high, and the first subregister stage 401 is constantly disabled. Such disabling of the first subregister stage 401 freezes the digital value that is currently stored in the register circuit 301, because the first subregister stage 401 cannot read in any new values while it is disabled.

On the right FIG. 3 shows another register circuit 310 for temporarily storing a digital value on a processing path of a microelectronic circuit. As a difference to the register circuit 301 on the left, the register circuit 310 on the right does not support time borrowing. Consequently it does not need to have the input CPD for a delayed clock signal. FIG. 3 also emphasizes that for temporarily storing the digital values the register circuits 301 and 310 do not need to comprise flip-flops but they may comprise latches instead.

Figure 5:
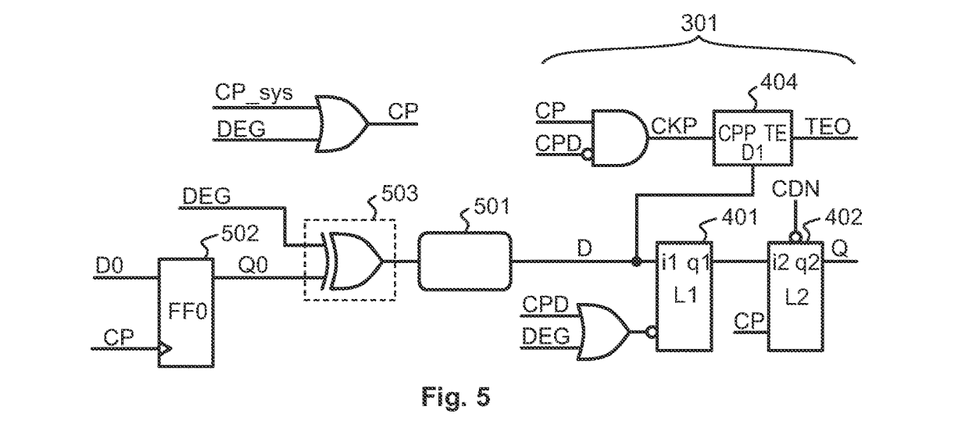
FIG. 5 illustrates a part of a processing path.

FIG. 5 shows a part of a delay-critical processing path of a microelectronic circuit. On the right in FIG. 5 is a register circuit 301 of the kind described above with reference to FIGS. 3 and 4. In the middle of FIG. 5 is a logic unit 501, so that the processing path considered here goes through the logic unit 501 to the register circuit 301. The circuit element that precedes the logic unit 501 on the processing path is another register circuit 502.

The microelectronic circuit comprises a controllable data event injection point 503 on that part of the processing path that leads to the first logic unit 501. A data event is an intentional change of a digital value. Thus the controllable data event injection point 503 is provided for controllably generating a change of a digital value propagating to the logic unit 501 irrespective of what other data is processed on the processing path. In this exemplary embodiment the controllable data event injection point 503 comprises an XOR gate, the inputs of which are the control signal DEG and the output Q0 of the other register circuit 502.

Figure 6:
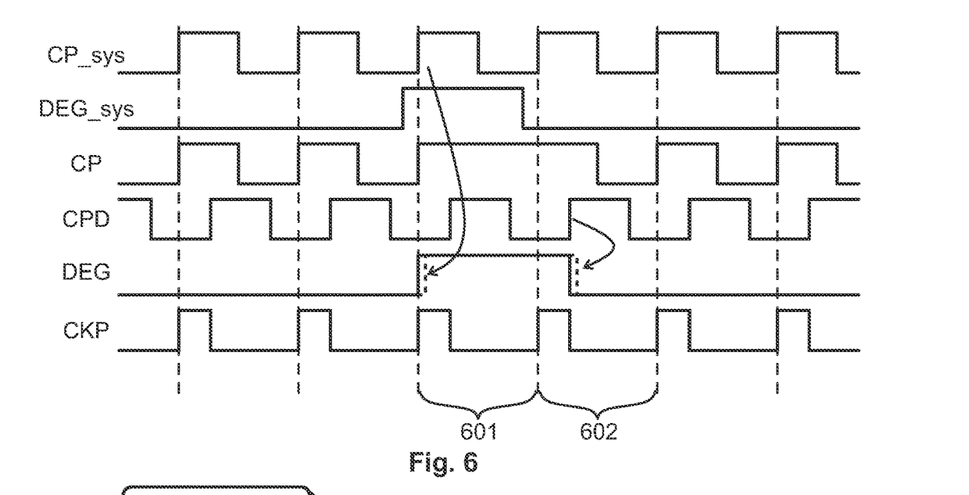
FIG. 6 illustrates waveforms of some signals in association with the processing path of FIG. 5.

FIG. 6 shows an example of how certain signals may look like in a microelectronic circuit that comprises the delay-critical processing path of which FIG. 5 shows a part. The topmost waveform illustrates a signal CP_sys, which is a system clock that defines a primary clock frequency and provides a stream of triggering events throughout the microelectronic circuit. The second waveform illustrates a signal DEG_sys, which is a system-level control signal that a piece of control software may use to initiate the activation of one or more delay-critical processing paths. In the example of FIG. 6 the signal DEG_sys goes high slightly before the beginning of the clock cycle 601, but this is only an example: there is no particular rule at which point of the clock cycle the signal DEG_sys should change its value.

The fifth waveform in FIG. 6 illustrates the control signal DEG, which is the control signal used to controllably generate the respective changes of digital values for activating the delay-critical processing paths. The control signal DEG is also used to freeze temporarily stored digital values in pertinent register circuits in order not to allow the activation to corrupt actual processed data. The rising edge in the control signal DEG is synchronized to that rising edge in the system clock CP_sys that follows a rising edge in the signal DEG_sys. The subsequent falling edge in the control signal DEG is synchronized to the rising edge in the delayed triggering signal CPD that follows the falling edge in the signal DEG_sys. The delayed triggering signal CPD is shown as the fourth waveform in FIG. 6, and it is, as the name says, a delayed version of the system clock signal CP_sys.

The rising edge of the signal DEG is drawn as occurring simultaneously with a corresponding rising edge in the system clock signal CP_sys. In practice there may be some unavoidable physical delay, but timing aspects of this can be taken account using standard timing analysis tools and constraints during digital logic implementation. Similarly the falling edge of the signal DEG may take place slightly later than the corresponding rising edge in the signal CPD.

The third waveform in FIG. 6 illustrates a triggering signal CP, which is formed with an OR function between the system clock signal CP_sys and the control signal DEG. This is the triggering signal that triggers the second subregister stage 402 in the register circuit 301, and that also triggers the other register circuit 502 from which the processing path in question comes to the logic unit 501. As shown in FIG. 6, pulses in the triggering signal CP are temporarily disabled for the duration of time when the control signal DEG is high. When the control signal DEG goes low, the triggering signal CP continues to follow the system clock signal CP_sys.

The activation of the delay-critical processing path works as follows. When the signal DEG_sys goes high, also the control signal DEG goes high. This causes the first subregister stage 401 in the register circuit 301 to be disabled. Simultaneously the triggering signal CP temporarily ceases to clock the second subregister stage 402. Together these actions mean that the digital value currently stored in the register circuit 301 is frozen. In general, it may be characterized that the microelectronic circuit is configured to perform said freezing of the digital value stored in the register circuit 301 by temporarily preventing changes in the signals fed into the triggering signal inputs of the first and second subregister stages 401 and 402.

The XOR gate 503 between the other register circuit 502 and the logic unit 501 receives a high value at its upper input. This causes a change in its output, because if the output Q0 of the other register circuit 502 was high the result of the XOR function is low, and if the output Q0 of the other register circuit 502 was low the result of the XOR function is high. This change of digital value proceeds to the logic unit 501 and further to the data input D of the register circuit 301. If it gets there in time (i.e. within the clock cycle 601) nothing happens, because the first subregister stage 401 is disabled and does not read it in, and because the monitor circuit 404 does not detect a timing event. If it arrives late (i.e. within the first parts of the clock cycle 602) the pulse in the CKP signal (which is the triggering signal to the monitor circuit 404) has opened the timing event detection window, and the monitor circuit 404 produces a TEO signal.

That mentioned above holds as long as the timing event detection window is defined as in FIGS. 5 and 6, namely so that it is truly and solely for detecting timing events. In some cases it is advantageous if a monitor circuit can be used additionally (or alternatively) to data event detection. In other words, the monitor circuit could be configured to produce data event observation signals concerning changes of digital data that occurred at all. For that purpose there may be other alternatives for the location of the detection window with respect to the allowable time limit at or before which a digital value should change in the input of the monitored register circuit. In the example of FIG. 6, the high pulse in the CKP signal could be located on the left-hand side of the line that separates the clock cycles 601 and 602, or it could extend from a part in the end of clock cycle 601 to a part in the beginning of clock cycle 602.

Figure 7:
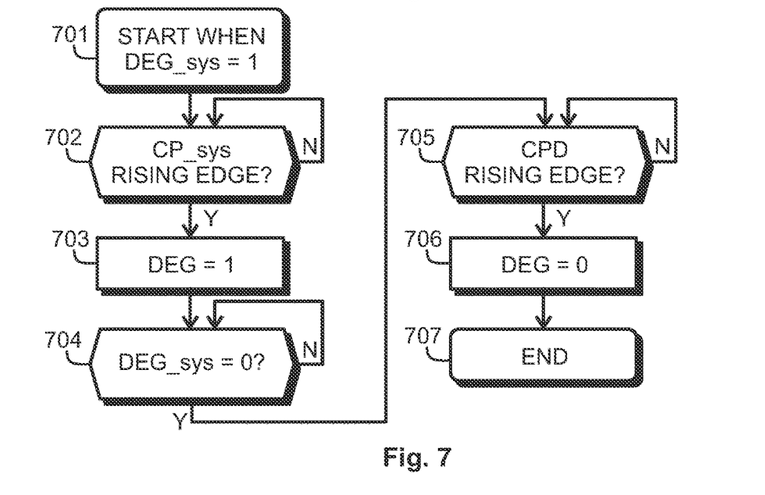
FIG. 7 illustrates an example of generating a DEG signal.

FIG. 7 illustrates an example of generating a control signal DEG so that it conforms with what has been said above with reference to FIG. 6. According to step 701 the method begins when the signal DEG_sys goes high. The loop in step 702 represents waiting for the next rising edge in the system clock signal CP_sys, at the occurrence of which the control signal DEG is set according to step 703. The consecutive loops in steps 704 and 705 represent first waiting for the signal DEG_sys to go low and then waiting for the next rising edge in the delayed clock signal CPD, at the occurrence of which the control signal DEG is reset according to step 706. This exemplary method ends at step 707.

The described activation of the delay-critical processing path works as intended as long as can be ensured that the change of digital data generated at the controllable data event injection point 503 indeed proceeds to the data input D of the register circuit 301. In some cases it is possible that this does not happen, but so-called blocking occurs. This possibility is described next with reference to FIG. 8.

Figure 8:
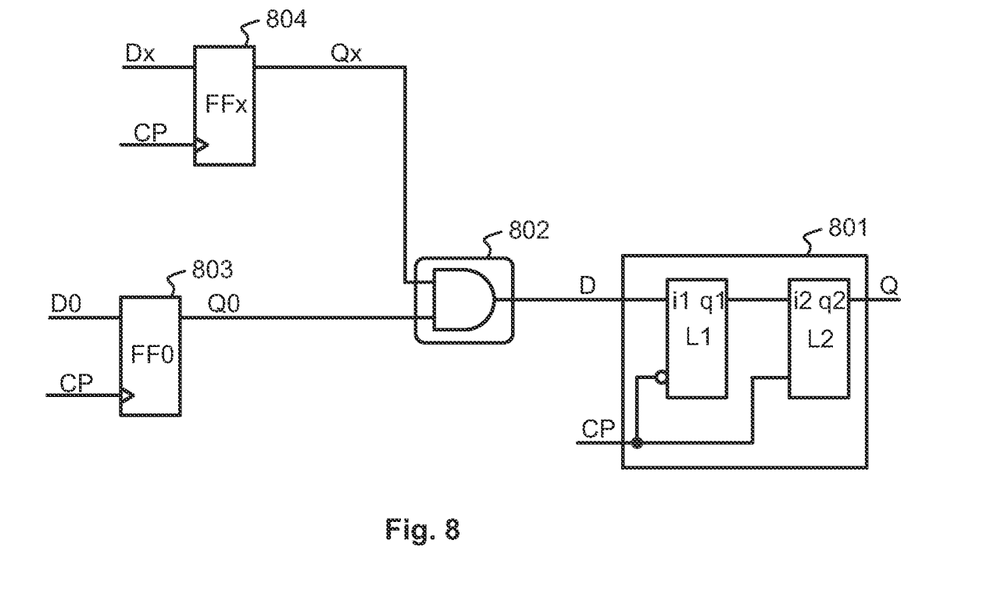
FIG. 8 illustrates a processing path without unblocking.

FIG. 8 illustrates a part of a processing path in a microelectronic circuit. A register circuit 801 is provided for temporarily storing a digital value that appears at the output of a logic unit 802. Another register circuit 803 precedes the logic unit 802 on the processing path. The processing path 803-802-801 is assumed here to be the delay-critical processing path.

There is yet another register circuit 804, the output of which is another input to the logic unit 802. The logic unit 802 implements essentially an AND function between the outputs Q0 and Qx of the register circuits 803 and 804 respectively. This means, among others, that if the output Q0 of the register circuit 803 goes high having previously been low, this change of digital data does not propagate through the logic unit 802 to the data input D of the register circuit 801 unless the output Qx of register circuit 804 is also high.

If there was a controllable data event injection point between register circuit 803 and the logic unit 802, and if this controllable data event injection point generated a data event in which the digital value going to the logic unit 802 on the delay-critical processing path went high, such a data event would not propagate to the register circuit 801 because it was blocked by the incompatible simultaneous other signal from register circuit 804.

Possible blocking of this kind can be prevented by providing one or more unblocking units on that or those other processing paths that come to the logic unit where blocking might occur. These unblocking units should be configured to prevent signals on said other processing path(s) from blocking the propagation of the change of digital value through the logic unit to the following register circuit. The exact implementation of the unblocking units can be selected when the structure and operation of that logic unit is known where blocking might occur.

Figure 9:
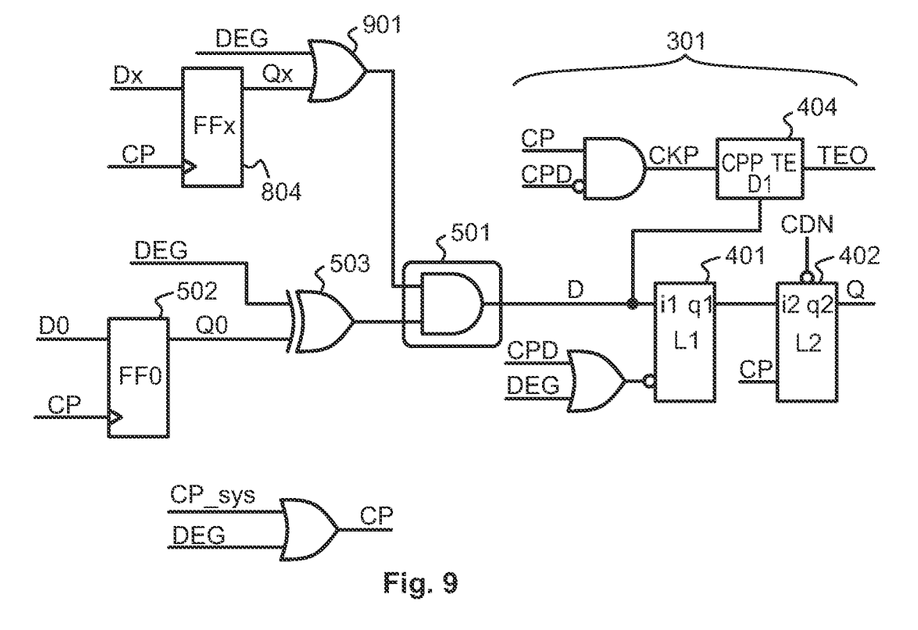
FIG. 9 illustrates a processing path with unblocking.

FIG. 9 illustrates an example, in which elements from FIGS. 5 and 8 have been combined. The logic unit 501 of FIG. 5 is here assumed to be essentially an AND function like in FIG. 8, and the register circuit 301 following it on the delay-critical processing path is capable of time borrowing and timing event detection, like in FIG. 5. The controllable data event injection point 503 is a XOR gate combining the control signal DEG and the output Q0 of the preceding register circuit 502 on the delay-critical processing path.

The unblocking unit is an OR gate 901 combining the control signal DEG and the output Qx of the other register circuit 804. An OR gate with the DEG signal as one input has been selected as the unblocking unit here because of the structure and operation of the logic unit 501 on the delay-critical processing path: in this particular case ensuring the correct propagation of the generated data event on the delay-critical processing path requires the signal from the other processing path to be high whenever the control signal DEG is high, i.e. whenever the activating of the delay-critical processing path takes place.

Figure 10:
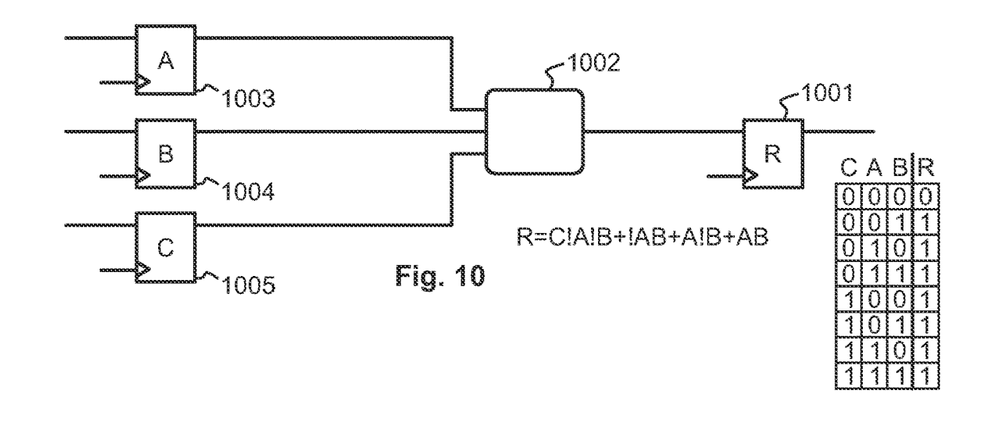
FIG. 10 illustrates a processing path without unblocking.
Figure 11:
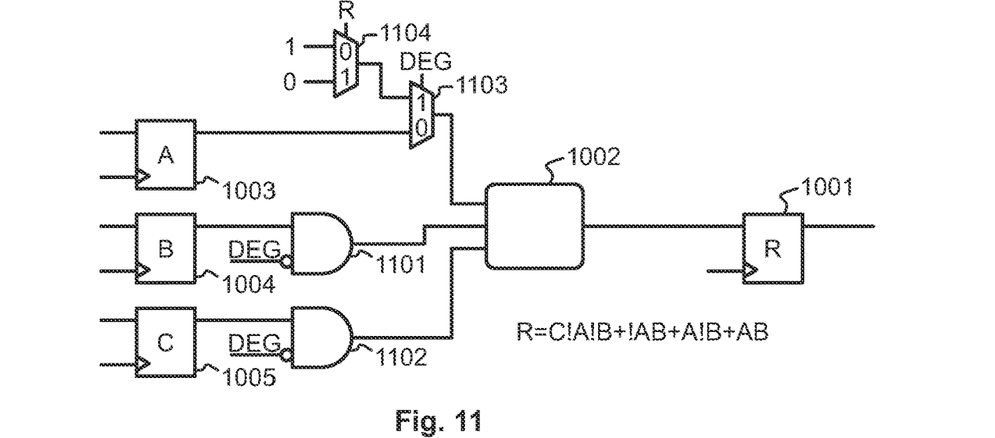
FIG. 11 illustrates a processing path with unblocking.
Figure 12:
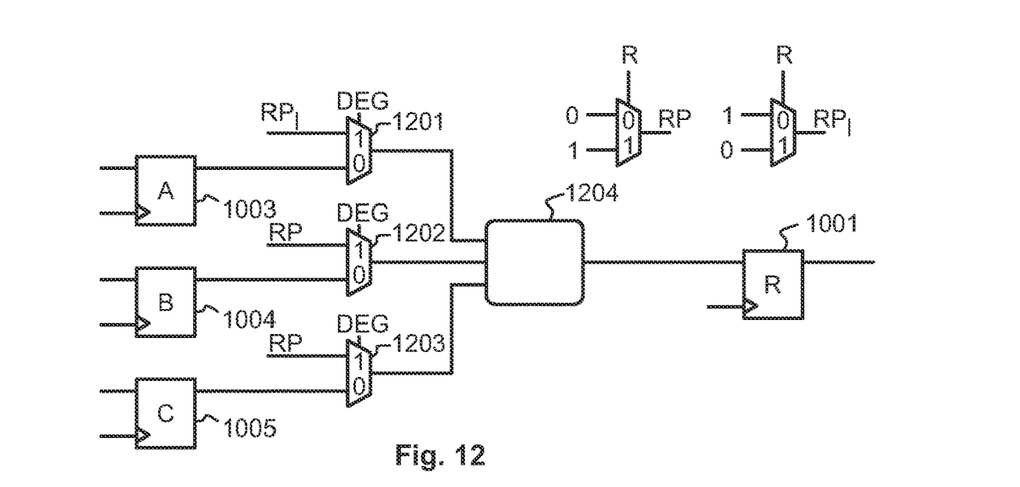
FIG. 12 illustrates a processing path with unblocking.

A more general example of unblocking is shown with reference to FIGS. 10 to 12. FIG. 10 illustrates a part of a processing path in a microelectronic circuit. A register circuit 1001, also marked here as the register circuit R, is provided for temporarily storing a digital value that appears at the output of a logic unit 1002. Another register circuit 1003, here the register circuit A, precedes the logic unit 1002 on the processing path. The processing path 1003-1002-1001 is assumed here to be the delay-critical processing path.

There are two other register circuits 1004 and 1005, here the register circuits B and C, the outputs of which are further inputs to the logic unit 1002. The digital values that the logic unit 1002 receives on the lines coming from the register circuits of FIG. 10 may be marked with the same letters as the register circuits themselves. The logic unit 1002 implements a logic function R=C!A!B+!AB+A!B+AB, where the exclamation mark "!" means inversion of the immediately following value. A truth table of this function is shown on the right in FIG. 10.

Activating the delay-critical processing path means that if the last stored value R in register circuit 1001 was zero it must be changed to one, and if the last stored value R in register circuit 1001 was one it must be changed to zero. There are four possible scenarios:

how to make R=0 when A=0?
how to make R=1 when A=0?
how to make R=0 when A=1?
how to make R=1 when A=1?

The truth table shows that making R=0 when A=1 is not possible. The two feasible ways of activating the delay-critical processing path is to make R=0 when A=0, or to make R=1 when A=1. Both can be realized with B=0 and C=0. Thus a controllable data event injection point between register circuit 1003 and the logic unit 1002, combined with an unblocking unit effective on the other processing paths involved can be implemented in the way shown in FIG. 11.

In the embodiment of FIG. 11 two additional AND gates 1101 and 1102 appear compared to FIG. 10, between the register circuit 1004 and the logic unit 1002 as well as between the register circuit 1005 and the logic unit 1002 respectively. Each of them receives the inverse of the DEG signal as one input. The first AND gate 1101 receives the output of the register circuit 1004 as the other input, and the second AND gate 1102 receives the output of the register circuit 1005 as the other input. The outputs of the AND gates 1101 and 1102 go to the logic unit 1002. Thus whenever the DEG signal is at logical high, the logic unit 1002 receives two zeroes from the direction of the register circuits 1004 and 1005. When the DEG signal is low, the outputs of the register circuits 1004 and 1005 go as such to the respective inputs of the logic unit 1002.

A first multiplexer 1103 between the register circuit 1003 and the logic unit 1002 on the delay-critical processing path receives the DEG signal as its control signal. A low value of the DEG signal lets the output of the register circuit 1003 pass through to the respective input of the logic unit 1002. A high value of the DEG signal selects the other input of the first multiplexer 1103 instead. It is coupled to a second multiplexer 1104, which receives the most recently stored value R as its control signal. The second multiplexer 1104 operates effectively as an inverter of R, so that R=0 causes value 1 and R=1 causes value 0 to be coupled to the respective input of the first multiplexer 1103. An inverter of R could be used in place of the second multiplexer 1104. The multiplexers 1103 and 1104 implement the controllable data event injection point.

The use of AND gates on the other processing paths, with the inverse of the signal DEG at one input, came from the fact that B=0 and C=0 were valid inputs to the logic unit 1002 in all cases of activating the delay-critical processing path. FIG. 12 shows a more general case in which DEG-controlled multiplexers 1201, 1202, and 1203 appear on all lines that come to the inputs of the logic unit 1204. Each of the multiplexers 1201, 1202, and 1203 has the normal course of the respective processing path coupled to that input that becomes selected with DEG=0. The other input is coupled to receive either the value RP reflecting directly the value R or its inverse, depending on what is the truth table of the logic unit 1204 and consequently how the input values to the logic unit 1204 should be selected during the activation of the delay-critical processing path.

The examples given above are easily generalized to any kind of processing paths, with any arbitrary number of inputs to any logic units. In each case knowing the functionality of the logic unit enables one to define a proper arrangement for activating the delay-critical processing path (which above was from the input A to R), which simultaneously ensures unblocking. The arrangement may mean selecting any combinations of constant values '1' and/or '0' and/or values that depend on the actual output value of the logic unit (here R).

Figure 13:
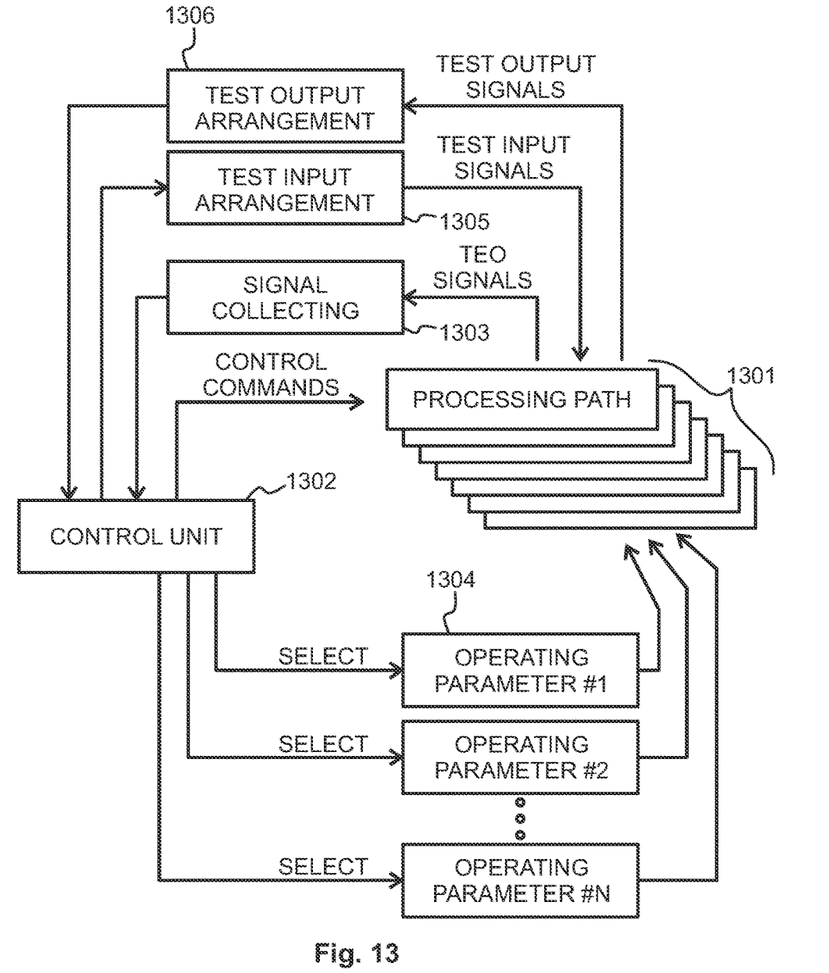
FIG. 13 illustrates a microelectronic circuit.

FIG. 13 illustrates schematically a microelectronic circuit that comprises a plurality of processing paths 1301 and a control unit 1302. One or more of the processing paths 1301 may be assumed to be delay-critical, and consequently equipped with register circuits capable of time borrowing and timing event detection, and also equipped with one or more controllable data event injection points for activating said delay-critical processing path(s) as needed. The control unit 1302 may activate any desired delay-critical processing path by giving the appropriate control commands. One or more signal collecting circuits 1303 are provided for collecting indicator signals, such as TEO signals, and for providing information about them to the control unit 1302.

At least part of the microelectronic circuit of FIG. 13 consists of adaptive circuit elements, the performance of which is configurable by making one or more operating parameters of the microelectronic circuit each assume a respective operating parameter value. Examples of operating parameters of this kind are an operating voltage, a frequency of a triggering signal, and a length of a timing event detection window. The selection of operating parameter values is schematically shown in FIG. 13 with the operating parameter blocks, of which block 1304 is an example.

For example a register circuit may be made an adaptive register circuit by ensuring that its performance is configurable by making one or more operating parameters of the register circuit each assume a respective operating parameter value. As such, a circuit element does not need to be adaptive in order to be included in an adaptive system or microelectronic circuit. An example could be an adaptive system or microelectronic circuit the supply voltage and/or energy consumption level and/or other parameter may be set from outside, while the internal circuit remains fixed and cannot be further configured: for example a monitoring window length may be fixed and not allowed to change.

The control unit 1302 of an adaptive microelectronic circuit is configured to select values for operating parameters based on results of performance measurements that it obtained from parts of the microelectronic circuit. Said results of performance measurements may for example indicate the number of detected timing events per unit time, collected through one or more signal-collecting circuits 1303.

The control unit 1302 may be configured to lower an operating voltage value as a response to the results mentioned above indicating a level of detected timing events that is below a first threshold. In order to avoid situations where the low number of detected timing events was due to low or nonexistent activity on a processing path, the control unit 1302 may be configured to activate one or more such processing paths.

The DFT capability of the microelectronic circuit of FIG. 13 is seen as the provision of a test input arrangement 1305 and a test output arrangement 1306. The test input arrangement 1305 makes it possible to selectively feed in test signals to the circuit elements of the processing paths 1301, and the test output arrangement 1306 enables selectively collecting test output signals from the circuit elements of the processing paths 1301. An example of using test input signals and test output signals, and the associated control commands that the control unit 1302 may use to selectively set the circuit elements in the processing paths 1301 into test mode, has been explained earlier in this text with reference to FIG. 1.

In general a method according to an embodiment for operating a microelectronic circuit comprises finding a period of inactivity on a delay-critical processing path of the microelectronic circuit, and activating said delay-critical processing path by controllably generating a change of a digital value propagating to a first logic unit on said delay-critical processing path. The method comprises also freezing, for a time during which said controllably generated change propagates to a first register circuit located after said first logic unit on said delay-critical processing path, a first digital value stored in said first register circuit.

As explained above, the freezing of said first digital value may be done by preventing a triggering signal from triggering at least one subregister stage in said first register circuit. The method may also comprise preventing digital values coming from other processing paths to said first logic unit from blocking the propagation of said controllably generated change through said first logic unit to said first register circuit.

Figure 14:
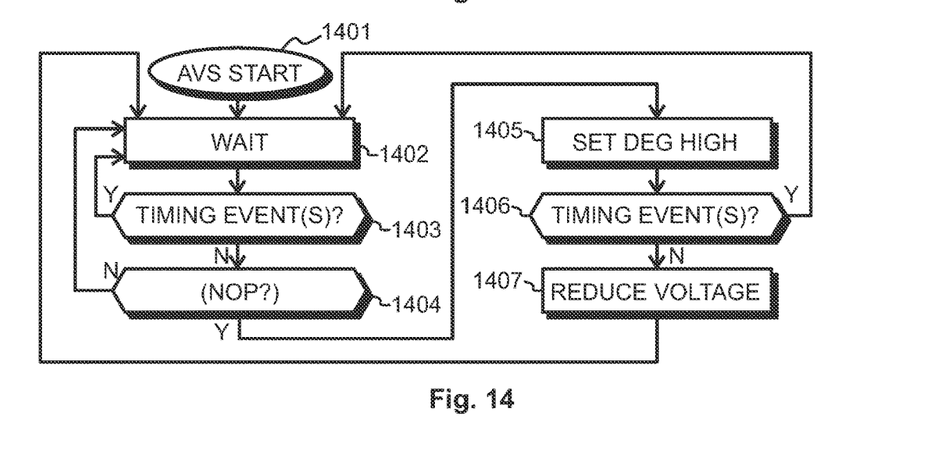
FIG. 14 illustrates a method.

In particular, FIG. 14 illustrates the use of the method for advanced voltage scaling. The drawing can be alternatively interpreted to illustrate a computer program product that can be stored upon a computer-readable medium and that comprises the machine-readable instructions referred to earlier in this text. According to state 1401 the advanced voltage scaling begins by having the operating voltage at a previously selected "safe" level, at which the microelectronic circuit is considered to operate appropriately. The loop through states 1402 and 1403 means applying timing event detection with the operating voltage at its current level.

If there are no detected timing events for a certain period of time, or if the number of timing events detected during said period of time is lower than a predetermined threshold, there might be a possibility to save power by lowering the operating voltage. However, the control unit of the microelectronic circuit does not actually know, whether the absence or low number of timing events is real, or whether it depends on the currently low activity on delay-critical processing paths. In order to proceed towards possible lowering of the operating voltage, the exemplary method shown in FIG. 14 proceeds to state 1405 where, at the occurrence of a DEG high signal, the clock is disabled for one clock cycle. This freezes the actual system functionality (i.e. the use of the system for its intended main purpose) for a clock cycle. There are various alternatives involved with such an implementation. For example, the system can be implemented in such a way that upon DEG activation it always skips one clock cycle in its actual functionality.

Another possibility is that the DEG signal is activated at the occurrence of a NOP instruction as in state 1404, leading to the activating of one or more delay-critical processing paths.

One of the effects of such activating is the generation of a change of digital value at the appropriate controllable data event injection point(s). According to state 1406, the method comprises using such controllably generated change to detect whether a delay longer than an allowable limit occurs in one or more delay-critical logic units. If not, the performance of the microelectronic circuit may be adapted at state 1407 by making an operating parameter assume an operating parameter value. If, on the other hand, the activating led to the detection of a timing event, it is deduced that the previously noted absence or low number of detected timing events was due to the low activity on delay-critical processing paths, so a return to state 1402 occurs without reducing the operating voltage.

It is not necessary to associate the activation of delay-critical processing paths with just NOP instructions, so state 1404 should be considered optional in FIG. 14. Another possibility is to miss a clock cycle in processing actual data, as has been explained above.

It is obvious to a person skilled in the art that with the advancement of technology, the basic idea of the invention may be implemented in various ways. The invention and its embodiments are thus not limited to the examples described above, instead they may vary within the scope of the claims.

What is claimed is:

1. A microelectronic circuit, comprising:
a plurality of logic units and register circuits, said plurality of logic units and register circuits arranged into a plurality of processing paths; and
at least one monitor circuit associated with a first register circuit of said plurality of register circuits, said at least one monitor circuit being configured to produce a timing event observation signal as a response to a change in a digital value at an input of the first register circuit that took place later than an allowable time limit defined by a triggering signal to said first register circuit;
wherein a first processing path of said plurality of processing paths goes through a first logic unit of said plurality of logic units to said first register circuit,
and wherein said first processing path is a delay-critical processing path due to an amount of delay that it is likely to generate,
and wherein the microelectronic circuit comprises, on the first processing path leading to said first logic unit, a controllable data event injection point for controllably generating a change of a digital value propagating to said first logic unit irrespective of what other data is processed on said first processing path,
and wherein said microelectronic circuit is configured to freeze a first digital value stored in said first register circuit for a time during which the change generated through said controllable data event injection point propagates to said first register circuit.

2. The microelectronic circuit according to claim 1, wherein:
said first register circuit comprises a data input, a data output, and between said data input and said data output a series connection of a first subregister stage and a second subregister stage, each of said first subregister stage and said second subregister stage having a respective triggering signal input, and
said microelectronic circuit is configured to perform said freezing of said first digital value by temporarily preventing changes in the signals fed into said triggering signal inputs of said first subregister stage and said second subregister stage.

3. The microelectronic circuit according to claim 2, wherein:

a control unit of said microelectronic circuit is configured to initiate said controllable generating of said change of said digital value propagating to said first logic unit by changing the value of a control signal, and the microelectronic circuit comprises a gating unit for gating, with said control signal, the signal going to the triggering signal input of said first subregister stage.

4. The microelectronic circuit according to claim 3, wherein said control unit is configured to initiate said controllable generating of said change of said digital value propagating to said first logic unit as a response to occurrence of a no-operation instruction in a program that is executed.

5. The microelectronic circuit according to claim 1, comprising one or more unblocking units on one or more other processing paths coming to said first logic unit, said one or more unblocking units being configured to prevent signals on said one or more other processing paths from blocking propagation of the generated change of said digital value through said first logic unit to said first register circuit.

6. The microelectronic circuit according to claim 1, wherein at least part of said microelectronic circuit consists of adaptive circuit elements, performance of which is configurable by making one or more operating parameters of the microelectronic circuit each assume a respective operating parameter value.

7. The microelectronic circuit according to claim 6, wherein said one or more operating parameters comprise one or more of the following: an operating voltage, a frequency of a triggering signal, a length of a timing event detection window.

8. A method for operating a microelectronic circuit, the method comprising:
   during a period of inactivity on a delay-critical processing path of the microelectronic circuit, activating said delay-critical processing path by controllably generating a change of a digital value propagating to a first logic unit on said delay-critical processing path, and
   freezing, for a time during which said controllably generated change propagates to a first register circuit located after said first logic unit on said delay-critical de-lay-critical processing path, a first digital value stored in said first register circuit.

9. The method according to claim 8, wherein said period of inactivity is one of:
   a period of inactivity deliberately generated by disabling a clock signal for one or more clock cycles, and
   an occurrence of a no-operation instruction in the microelectronic circuit.

10. The method according to claim 8, wherein said freezing of said first digital value is done by preventing a triggering signal from triggering at least one subregister stage in said first register circuit.

11. The method according to claim 8, comprising:
    preventing digital values coming from other processing paths to said first logic unit from blocking propagation of said controllably generated change through said first logic unit to said first register circuit.

12. The method according to claim 8, comprising:
    using said controllably generated change to detect whether a delay longer than an allowable limit occurs in said first logic unit, and
    adapting performance of the microelectronic circuit by making an operating parameter assume an operating parameter value depending on whether a delay longer than said allowable limit was detected to occur in said first logic unit.

13. A non-transitory computer-readable medium having a computer-readable program product stored thereon, the computer-readable program product comprising one or more sets of one or more computer-readable instructions that, when executed by one or more processors, are configured to cause the execution of a method for operating a microelectronic circuit, wherein the method comprises:
    during a period of inactivity on a delay-critical processing path of the microelectronic circuit, activating said delay-critical processing path by controllably generating a change of a digital value propagating to a first logic unit on said delay-critical processing path, and
    freezing, for a time during which said controllably generated change propagates to a first register circuit located after said first logic unit on said delay-critical processing path, a first digital value stored in said first register circuit.

* * * * *

UNITED STATES PATENT AND TRADEMARK OFFICE
CERTIFICATE OF CORRECTION

| | | Page 1 of 1 |
|---|---|---|
| PATENT NO. | : 12,113,530 B2 | |
| APPLICATION NO. | : 17/311197 | |
| DATED | : October 8, 2024 | |
| INVENTOR(S) | : Navneet Gupta | |

It is certified that error appears in the above-identified patent and that said Letters Patent is hereby corrected as shown below:

In the Claims

In Column 17, Line 42, Claim 8, delete "de-lay-critical processing" and insert -- processing --, therefor.

Signed and Sealed this
Seventh Day of January, 2025

Derrick Brent
*Acting Director of the United States Patent and Trademark Office*